United States Patent [19]

Lesk et al.

[11] Patent Number: 5,369,304

[45] Date of Patent: Nov. 29, 1994

[54] CONDUCTIVE DIFFUSION BARRIER OF TITANIUM NITRIDE IN OHMIC CONTACT WITH A PLURALITY OF DOPED LAYERS THEREFOR

[75] Inventors: Israel A. Lesk, Phoenix; Francine Y. Robb, Tempe; Lewis E. Terry, Phoenix; Frank S. d'Aragona, Scottsdale, all of Ariz.

[73] Assignee: Motorola, Inc., Schaumburg, Ill.

[21] Appl. No.: 929,232

[22] Filed: Aug. 14, 1992

[51] Int. Cl.$^5$ .................. H01L 29/74; H01L 29/46; H01L 23/485
[52] U.S. Cl. ........................ 257/782; 257/47; 257/783; 257/915
[58] Field of Search .............. 257/915, 565, 654, 629, 257/44–47, 754, 757, 764, 768, 770, 777, 782, 783, 751, 587, 584

[56] References Cited

U.S. PATENT DOCUMENTS

| | | | |
|---|---|---|---|
| 4,827,363 | 5/1989 | Thomas et al. | 257/755 |
| 5,004,705 | 4/1991 | Blackstone | 437/225 |
| 5,183,769 | 2/1993 | Rutter et al. | 257/684 |

*Primary Examiner*—Rolf Hille
*Assistant Examiner*—Peter Toby Brown
*Attorney, Agent, or Firm*—Robert F. Hightower; Joe E. Barbee

[57] ABSTRACT

A plurality of doped areas (12, 13, 14) are formed on a surface of a semiconductor wafer. A titanium nitride layer (17) is used for covering the plurality of doped areas (12, 13, 14) and for providing electrical connection between the doped areas (12, 13, 14). The titanium nitride layer (17) substantially prevents dopants from diffusing into the titanium nitride (17) and subsequently counterdoping the doped areas (12, 13, 14) during subsequent high temperature processing operations.

6 Claims, 1 Drawing Sheet

CONDUCTIVE DIFFUSION BARRIER OF TITANIUM NITRIDE IN OHMIC CONTACT WITH A PLURALITY OF DOPED LAYERS THEREFOR

This application is related to co-pending application Ser. No. 07/696,405 filed by Robert Rutter et al on May 6, 1991.

BACKGROUND OF THE INVENTION

The present invention relates, in general, to semiconductor structures, and more particularly, to semiconductor structures utilizing titanium nitride as a dopant diffusion barrier.

Previously, the semiconductor industry has employed wafer bonding techniques to attach an active semiconductor wafer to a handle wafer. The handle wafer generally is used to support the active wafer during subsequent processing and assembly operations. A problem arises when the active wafer has doped semiconductor regions that are electrically connected by metal areas. At the high temperatures utilized to perform wafer bonding, previous conductor materials, such as tungsten-silicide, provide a migration path that allows dopants to diffuse from one doped semiconductor area to another. This diffusion path permits P-type dopants to counter dope N-type areas, and N-type dopants to counter dope P-type areas thereby degrading or destroying the semiconductor device's operation. The diffusion occurs both laterally and transversely through the conductor. The lateral diffusion occurs near the surface that forms an interface between the conductor and the doped regions. Such lateral diffusion through the conductor near the metal-semiconductor interface destroys ohmic contact between the conductor and the doped areas by counter doping a portion of the doped area that is in contact with the conductor. The transverse diffusion is perpendicular to the conductor's surfaces and can degrade a semiconductor device's performance by transporting dopants from desired positions.

Accordingly, it is desirable to have a conductor that functions as a dopant diffusion barrier at high temperatures, that maintains ohmic contact during high temperature operations, and that facilitates bonding a handle wafer to an active semiconductor wafer.

SUMMARY OF THE INVENTION

Briefly stated, the present invention includes forming a plurality of doped areas on a surface of a semiconductor wafer. A titanium nitride layer is used for covering the plurality of doped areas and for providing electrical connection between the doped areas. The titanium nitride layer forms a diffusion barrier that substantially prevents dopants from diffusing laterally through the titanium nitride and subsequently counterdoping the plurality of doped areas.

A structure formed by the method is also included.

DETAILED DESCRIPTION OF THE DRAWINGS

Figure 1:
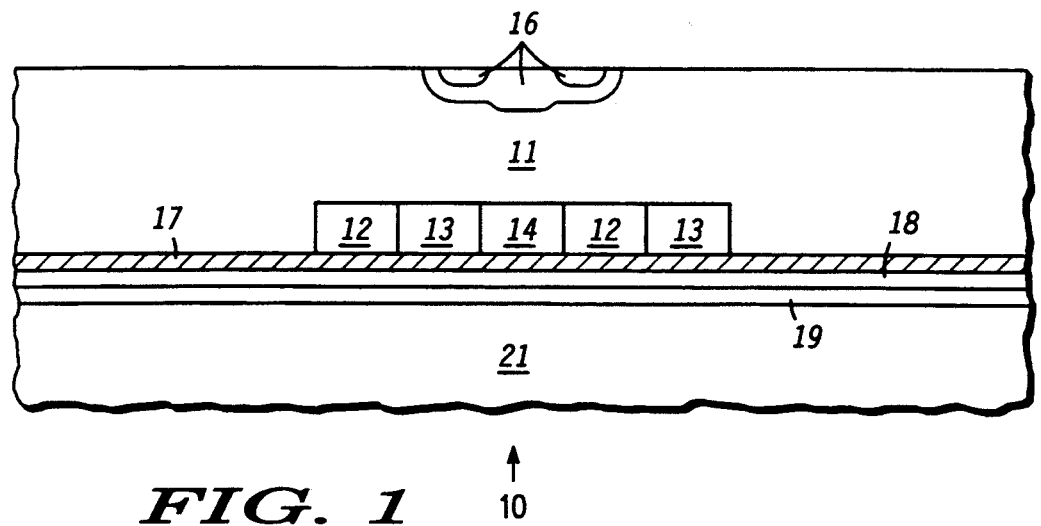
FIG. 1 illustrates an enlarged cross-sectional portion of bonded semiconductor wafers in accordance with the present invention.

FIG. 1 illustrates an enlarged cross-sectional portion of a semiconductor wafer 10 that includes an active semiconductor wafer 11 and another semiconductor wafer that functions as a handle wafer 21. Wafer 21 generally assists in supporting wafer 11 during subsequent processing operations. Prior to the bonding operation, a plurality of doped areas 12, 13, and 14 are formed on or in a first surface of wafer 11. Areas 12, 13, and 14 can have different conductivity types, can have different doping concentrations of the same conductivity type, or combinations of both. For example, area 12 could be N-type, area 13 heavily doped P-type, and area 14 heavily doped N-type; or adjacent areas could alternate between N-type and P-type. Additionally, areas 12, 13, and 14 may be spaced apart from each other. Areas 12, 13, and 14 are electrically connected by applying a titanium nitride layer 17 that covers areas 12, 13, and 14. Layer 17 can be applied by reactive ion sputtering, plasma enhanced chemical vapor deposition, or other similar methods that are well known to those skilled in the semiconductor process art. The thickness of layer 17 generally is determined by the equivalent series resistance that is desired for layer 17. In the preferred embodiment, layer 17 is between approximately 50 and 500 nano-meters thick.

Depending on the temperature and atmosphere in which the subsequent wafer bonding operation is performed, portions of titanium nitride layer 17 may be converted to titanium oxide ($TiO_2$). Since titanium oxide is an insulator, the titanium oxide would destroy electrical connection between areas 12, 13, and 14. In order to prevent oxidation of titanium nitride layer 17, layer 17 is optionally covered with a protective layer 18. The materials used for layer 18 should withstand wafer bonding temperatures, and prevent oxygen from reaching layer 17. Suitable materials include, but are not limited to, polysilicon, silicon dioxide, tungsten silicide, and silicon nitride. In the preferred embodiment, layer 18 is polysilicon in order to provide adhesion between layer 18 and wafer 21. If the wafer bonding operation is conducted in a non-oxidizing atmosphere, layer 18 may not be required. In some cases, layer 18 is covered with a refractory metal silicide layer 19, such as tungsten silicide, that enhances adhesion of wafer 21. Layer 19 may be applied to either wafer 21 or to layer 18.

Wafer bonding wafer 11 to wafer 21 is accomplished by placing a surface of layer 17 in contact with wafer 21, or optionally layer 18 in contact with either layer 19 or wafer 21, and heating wafers 11 and 21 to a temperature between approximately 1,050 and 1,250 degrees Celsius (°C.). It has been found that performing the bonding in a steam atmosphere can enhance adhesion at the periphery of wafers 11 and 21. The high temperatures used for wafer bonding also anneal layer 17 thereby lowering the sheet resistivity to a value of less than approximately 50 micro ohm-cm. In the preferred embodiment, layer 17 has a sheet resistivity not greater than approximately 35 micro ohm-cm. In addition, the annealing lowers the contact resistance between layer 17 and areas 12, 13, and 14 thereby forming ohmic contact between layer 17 and areas 12, 13, and 14.

During the wafer bonding operation, layer 17 functions as a diffusion barrier that prevents dopants within any one of areas 12, 13, and 14 from diffusing through layer 17 and counterdoping another one of areas 12, 13, and 14. That is, since dopants can not diffuse into layer 17, dopants are prevented from diffusing transversely through layer 17 from one doped area to another. For example, the diffusion barrier properties of layer 17 prevent P-type dopants from area 12 from diffusing laterally through layer 17 and into areas 13 and 14. Therefore, layer 17 prevents dopant diffusion from destroying the ohmic contact that is formed between layer 17 and areas 12, 13, and 14.

Once wafers 11 and 21 are bonded, active devices are formed in wafer 11. For example, a plurality of doped areas 16 may be formed on a second surface of active wafer 11. Such doped areas provide semiconductor devices and structures such as enhanced insulated gate bipolar transistors (EIGBTs), triacs, bilateral shorted emitter switches, or other structures utilizing a buried conductor layer.

Figure 2:
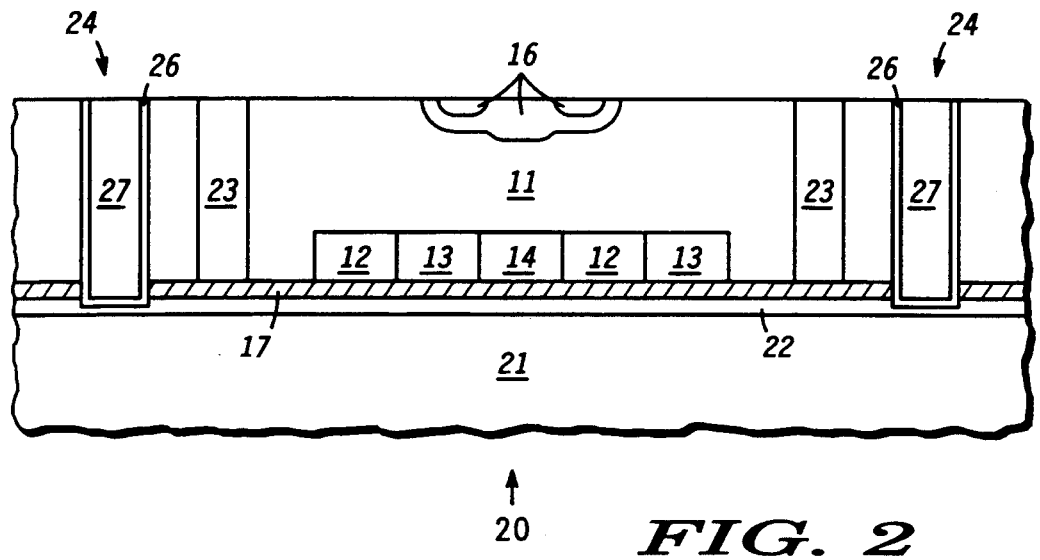
FIG. 2 illustrates an alternate embodiment of the bonded wafers of FIG. 1 in accordance with the present invention.

Referring to FIG. 2, the conductive diffusion barrier formed by titanium nitride layer 17 of FIG. 1 can be utilized to provide a variety of semiconductor structures including a dielectric isolated wafer 20. In order to form wafer 20, semiconductor wafer 11 is formed to include a titanium nitride layer 17 that covers areas 12, 13, and 14 as described in FIG. 1. A silicon dioxide layer 22 is applied to layer 17 as a protective layer that prevents oxidizing layer 17 during subsequent wafer bonding operations, and also as a dielectric layer that facilitates the formation of dielectric isolated circuits. Subsequently, handle wafer 21 is bonded to layer 22 by the methods described in FIG. 1.

After the bonding is complete, wafer 11 is thinned by well known methods such as grinding and chemical-mechanical polishing. Subsequently, conductive sinkers 23 are formed in active wafer 11 to provide electrical connection between layer 17 and other structures of wafer 20. Sinkers 23 typically are heavily doped regions within wafer 11 that provide a low resistance conduction path. In order to provide lateral isolation, dielectric trenches 24 are formed to extend from the surface of wafer 20 at least into dielectric layer 22. Typically, a dielectric liner 26 is formed along the sidewalls of trenches 24, and then trenches 24 are filled with a solid plug 27. In the preferred embodiment, liner 26 is silicon dioxide and plug 27 is polysilicon. Also in the preferred embodiment, trenches 24 form a ring that surrounds sinkers 23 and areas 12, 13, and 14. Active device elements, such as doped areas 16, are then formed in wafer 11. Such active devices, illustrated by doped areas 16, are dielectrically isolated from other devices or structures on wafer 20.

The dielectric configuration illustrated is exemplary of dielectrically isolated structures wherein fabrication is facilitated by a conductive diffusion barrier such as layer 17. Other configurations employing such a layer 17 are also within the scope provided by the example of FIG. 2. Thus, wafer 20 is useful in providing a variety of dielectric isolated devices and structures including EIGBTs, triacs, and bidirectional switches with shorted emitters.

Figure 3:
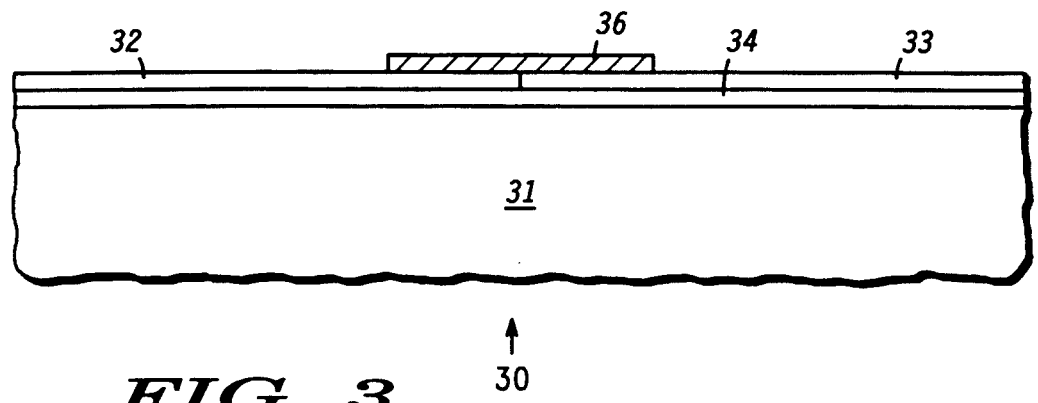
FIG. 3 illustrates an enlarged cross-sectional portion of a transistor in accordance with the present invention.

FIG. 3 illustrates a portion of a complementary metal oxide semiconductor (CMOS) wafer 30 that utilizes titanium nitride layer 17 of FIG. 1 as an electrically conductive diffusion barrier. Wafer 30 includes a substrate 31 and a dielectric layer 34, often referred to as the field, that covers a portion of wafer 31. In order to provide high performance CMOS circuits, the gate electrodes of N-channel transistors generally are formed as a polysilicon layer 32 that is doped N-type. Similarly, the gate electrodes of P-channel transistors are formed as a P-type polysilicon layer 33. Often, it is necessary to electrically connect the P-channel gate electrode to the N-channel gate electrode. This is done over layer 34, and typically is accomplished by abutting a portion of layers 32 and 33 and applying a conductor to the abutted area in order to provide a low resistance conduction path between the gate electrodes. Alternately, layers 32 and 33 may be brought close together and the conductor used to bridge the gap between layers 32 and 33. During subsequent high temperature processing operations, previous materials used to form the conductor, such as tungsten silicide ($WSi_2$), permitted dopants to diffuse from layer 32, through the tungsten silicide, and into the layer 33, and vice versa thereby counterdoping the polysilicon, increasing the resistance between layers 32 and 33, and altering the transistor's performance. It has been found that using a titanium nitride conductor prevents the lateral dopant diffusions, and improves the CMOS circuit's performance. Therefore, portions of polysilicon layers 32 and 33 are covered with a titanium nitride layer 36 which forms an ohmic contact to layers 32 and 33, and maintains the ohmic contact through subsequent high temperature, greater than 900° C., operations. During subsequent high temperature processing operations, layer 36 forms a diffusion barrier that prevents dopants within polysilicon layer 32 from affecting the doping concentration and doping type of polysilicon layer 33 and vice versa. Thus, layer 36 assists in providing a high performance CMOS circuit.

The dopant diffusion barrier formed by layer 36 is also useful in a variety of other CMOS device structures including a doped polysilicon to silicon contact. In such a contact, layer 33 is not applied, an opening is formed through layer 34 and is positioned under layer 36 so that a portion of layer 36 fills the opening and contacts substrate 31. Thus, a portion of layer 36 forms a polysilicon to silicon contact that prevents dopants from diffusing through layer 36 and counterdoping either layer 32 or substrate 31.

By now it should be appreciated that there has been provided a novel way to prevent dopant transport during high temperature processing operations. Utilizing titanium nitride as a conductor for interconnecting doped areas prevents dopant transport laterally through the conductor and into the doped areas. In addition, the titanium nitride also prevents dopant transport transversely through the conductor. Use of titanium nitride as a conductive diffusion barrier facilitates the formation of high performance CMOS circuits, dielectric isolated circuits, enhanced insulated gate bipolar transistors (EIGBTs), and a variety of other semiconductor structures.

We claim:

1. A semiconductor wafer having a conductive diffusion barrier comprising:
   a semiconductor wafer having a plurality of doped areas in a surface of the wafer;
   a layer of titanium nitride covering the plurality of doped areas and in ohmic contact with the plurality of doped areas wherein the titanium nitride forms a diffusion barrier that prevents dopants within a first doped area of the plurality of doped areas from diffusing laterally through the titanium nitride and into a second doped area of the plurality of doped areas;

a protective layer covering the titanium nitride wherein the protective layer includes a layer of polysilicon, silicon dioxide or silicon nitride; and a handle wafer bonded to the protective layer by wafer bonding.

2. The semiconductor wafer of claim 1 wherein the plurality of doped areas includes a P-type area adjacent to an N-type area, and a heavily doped area adjacent to a lightly doped area.

3. The semiconductor wafer of claim 1 wherein the layer of titanium nitride has a resistivity of less than 50 micro ohm-centimeter subsequent to the wafer bonding.

4. A semiconductor wafer having a conductive diffusion barrier comprising:

a semiconductor wafer having a plurality of doped areas in a surface of the wafer;

a layer of titanium nitride covering the plurality of doped areas and in ohmic contact with the plurality of doped areas wherein the titanium nitride forms a diffusion barrier that prevents dopants within a first doped area of the plurality of doped areas from diffusing laterally through the titanium nitride and into a second doped area of the plurality of doped areas;

a protective layer covering the titanium nitride wherein the protective layer includes a layer of polysilicon; and a handle wafer bonded to the protective layer by wafer bonding.

5. A semiconductor wafer having a conductive diffusion barrier comprising:

a semiconductor wafer having a plurality of doped areas in a surface of the wafer;

a layer of titanium nitride covering the plurality of doped areas and in ohmic contact with the plurality of doped areas wherein the titanium nitride forms a diffusion barrier that prevents dopants within a first doped area of the plurality of doped areas from diffusing laterally through the titanium nitride and into a second doped area of the plurality of doped areas;

a protective layer covering the titanium nitride; and a handle wafer bonded to the protective layer by wafer bonding a refractory metal silicide on a surface of the handle wafer to the protective layer.

6. The semiconductor wafer of claim 5 wherein the refractory metal silicide includes tungsten silicide.

* * * * *